United States Patent [19]
Lawton et al.

[11] Patent Number: 4,596,963
[45] Date of Patent: Jun. 24, 1986

[54] PLL WITH LOCK UP DETECTOR AND LOCK ACQUISITION CIRCUIT

[75] Inventors: Rodney J. Lawton; Peter W. Gaussen; Ian A. Strachan; Philip I. J. Ainsley, all of Swindon, England

[73] Assignee: Plessey Overseas Limited, Ilford, England

[21] Appl. No.: 630,406

[22] Filed: Jul. 13, 1984

[30] Foreign Application Priority Data

Jul. 13, 1983 [GB] United Kingdom ............... 8318888

[51] Int. Cl.⁴ .............................................. H03L 7/06
[52] U.S. Cl. ...................................... 331/14; 331/25; 331/DIG. 2
[58] Field of Search ........... 331/4, 14, 17, 25, DIG. 2

[56] References Cited

U.S. PATENT DOCUMENTS

| | | | |
|---|---|---|---|
| 4,135,166 | 1/1979 | Marchetti | 331/14 |
| 4,365,211 | 12/1982 | Lee | 331/14 X |
| 4,423,390 | 12/1983 | Waters | 331/4 |
| 4,484,152 | 11/1984 | Lee | 331/17 X |

FOREIGN PATENT DOCUMENTS

| | | | |
|---|---|---|---|
| 0072541 | 6/1981 | Japan | 331/DIG. 2 |
| 0066228 | 4/1984 | Japan | 331/DIG. 2 |
| 1089074 | 11/1967 | United Kingdom . | |
| 1111806 | 5/1968 | United Kingdom . | |
| 1265447 | 3/1972 | United Kingdom . | |

OTHER PUBLICATIONS

Blanchard, A. "Phase-Locked Loops Application to Coherent Receiver Design" John Wiley and Sons, N.Y., 1976, pp. 280-289.

Primary Examiner—Eugene R. LaRoche
Assistant Examiner—D. C. Mis
Attorney, Agent, or Firm—Fleit, Jacobson, Cohn & Price

[57] ABSTRACT

A phase lock loop circuit comprises a variable frequency oscillator having a control input and an output, a divider having an input coupled with the output of the oscillator and an output coupled with the first input of a phase or frequency comparator. The comparator has a second input for a reference frequency ($F_{REF}$) and an output coupled with the oscillator control input for providing a signal which is related to the difference in phase or frequency of the signals at the first and second inputs to effect phase locking of the oscillator to the reference signal. A detector provides a switching signal when the control signal falls outside a predetermined range and a switch in the phase lock loop is responsive to the switching signal to open the loop.

4 Claims, 4 Drawing Figures

PLL WITH LOCK UP DETECTOR AND LOCK ACQUISITION CIRCUIT

This invention relates to a phase lock loop circuit which has a predetermined frequency operating range and which is resistant to lock up.

Phase lock loop circuits in which a variable frequency oscillator is responsive to a control signal for locking the oscillator to a reference frequency are capable of being driven into a lock up condition where self oscillation occurs. The present invention seeks to provide a phase lock loop circuit in which this tendency is avoided.

According to the invention there is provided a phase lock loop circuit, comprising a variable frequency oscillator having a control input and an output, a divider having an input coupled with the output of the oscillator and an output coupled with a first input of a phase or frequency comparator, the comparator having a second input for a reference frequency and an output coupled with the oscillator control input for providing a signal which is related to the difference in phase or frequency of the signals at said first and second inputs to effect phase locking of the oscillator to the reference signal, a detector for providing a switching signal when the control signal falls outside a predetermined range and a switch in the loop responsive to the switching signal to open the loop. By opening the loop when the control signal falls outside the predetermined operating range the circuit is prevented from being driven into a self oscillating or lock up condition.

The control signal may be a voltage in which case the detector is a voltage sensor arranged to provide an actuating signal for said switch when the voltage falls outside a predetermined range.

The voltage sensor may comprise a voltage comparator having a first input coupled with the oscillator control input, a second input for a reference voltage and an output for providing the switch actuating signal when the inputs have a predetermined relationship.

The phase or frequency detector may be a digital detector which is coupled via a charge pump to the control input of the oscillator. The digital detector may have two output lines coupled to the charge pump, a first one of the lines for providing pulses indicative of a required increase in frequency to promote locking and a second one of the lines for providing pulses indicative of a required reduction of frequency to promote locking.

In a refinement of the invention a bistable trigger circuit may be provided having set and reset inputs one coupled with the control input of the oscillator and the other with said first one of the lines to the charge pump and an output for controlling the switch, whereby triggering to one stable state and opening of the switch is effected when the control signal is representative of a frequency below said predetermined range and triggering to the other stable state and closure of the switch is effected upon occurrence of pulses indicative of a required increase in frequency to promote locking.

The switch may be arranged to couple a current source to the oscillator control input when the loop is opened.

The divider may have a variable division ratio.

In order that the invention and its various other preferred features may be understood more easily, embodiments thereof will now be described, by way of example only, with reference to the drawings, in which.

Figure 1:
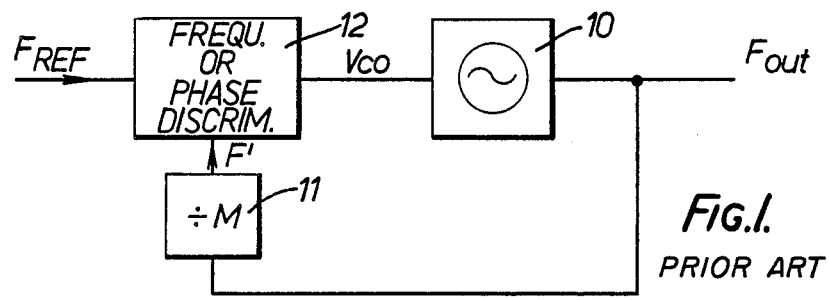
FIG. 1 is a schematic block diagram of a conventional phase lock loop circuit.

Referring now to FIG. 1 there is shown the basic principle of a phase lock loop of the type in which an oscillator 10 is connected in a closed loop with a divider 11 and a frequency or phase discriminator 12. As well as receiving an input F' which is equal to the output frequency $F_{OUT}$ of the oscillator divided by the division ratio M of the divider, the discriminator receives a reference frequency input $F_{REF}$. The discriminator compares the two inputs F' and $F_{REF}$ for phase or frequency coherence and provides a correcting voltage Vco which is applied to a frequency control element, e.g. a varactor diode, or the oscillator 10. Accordingly the oscillator is locked to the reference frequency but has a frequency which is $F_{REF} \times M$.

Figure 2:
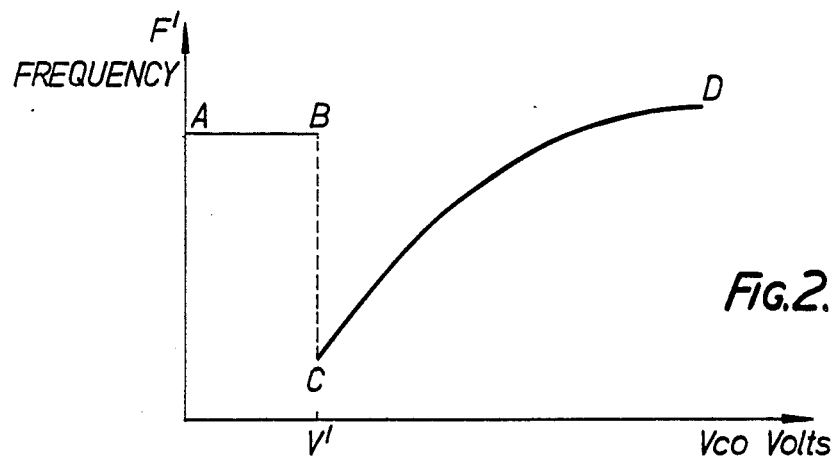
FIG. 2 shows graphically the transfer function of the phase lock loop of FIG. 1.

FIG. 2 shows the transfer characteristic of the loop and plots Vco against F'. The control loop is intended to operate in the region C to D of the characteristic which results in negative feedback in the loop and stable controlled operation. However, if due to some disturbance e.g. transients, overshoot, or power fluctuation the control voltage Vco falls below V' the loop is driven into a positive feedback operation in the region A to B of the characteristic. The oscillator 10 stops oscillating and the loop self oscillates, or the divider 11 self oscillates, and the loop becomes "locked up" at the frequency F'. The point V' is poorly defined and cannot be predicted accurately. This is a major problem with phase lock loops and is what the present invention seeks to aleviate.

Figure 3:
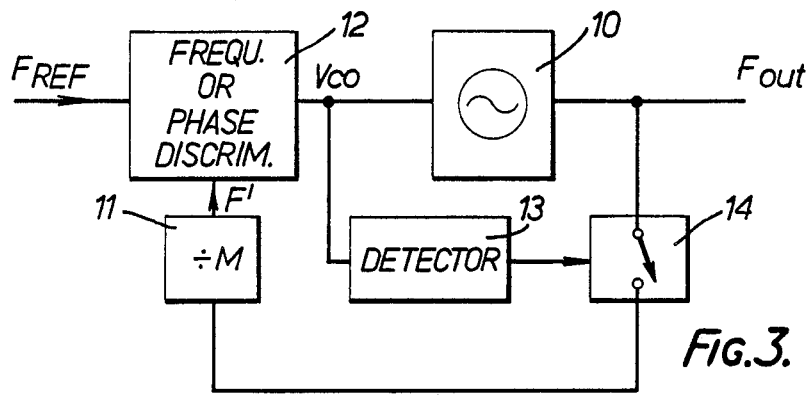
FIG. 3 is a schematic block diagram illustrating the basic interconnection of circuit blocks to provide a circuit in accordance with the invention.

FIG. 3 shows how the basic system can be modified to overcome lock up and provide a phase lock loop in accordance with the invention. A detector 13 has an input which is coupled to the output of the discriminator 12 and receives the control voltage Vco. The detector is arranged to sense when the control voltage Vco falls to a level of the order of V', where risk of lock up occurs, and to open the loop by actuating an electronic switch 14. The frequency F' fed back by the loop is no longer present at the input to the discriminator 12 and the discriminator sees this as a loop frequency that is too low and provides an increased voltage output as an instruction to the oscillator 10 to increase its frequency. The detector 13 is provided with a suitable switching hysteresis, and/or delay, and when Vco reaches a suitable level it reconnects the loop. Instead of positioning the switch 14 between the oscillator 10 and divider 11 it could be positioned at any other suitable position in the loop. The switch could be positioned between the discriminator 12 and oscillator 10 and be a change over type arranged to connect a charging current to the control input to maintain oscillation when the control voltage Vco falls to a predetermined level.

Figure 4:
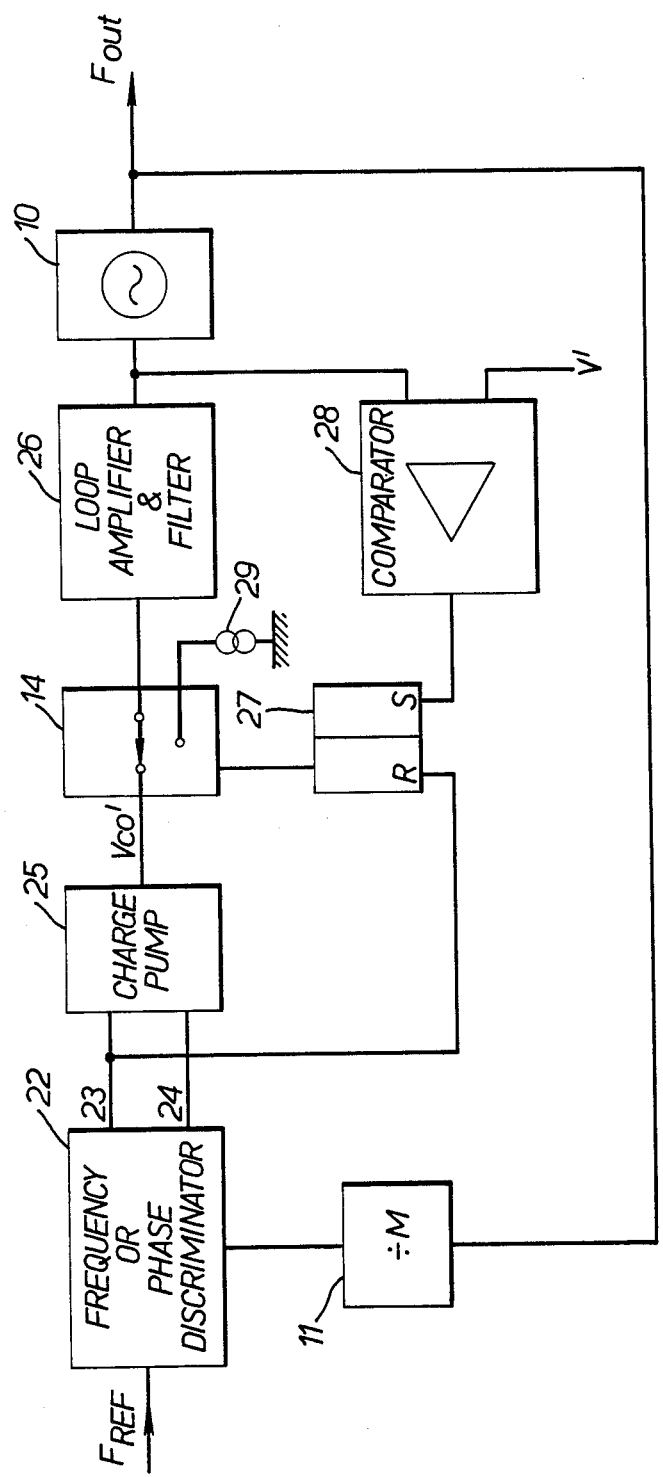
FIG. 4 shows a particularly advantageous refinement of the invention.

FIG. 4 shows a particularly advantageous refinement of the invention in which the discriminator is a digital discriminator 22 which provides outputs on two output lines 23 and 24 to a charge pump 25. The line 23 provides pulses indicative that F' is too low and that an increase in frequency of oscillator 10 is required whilst line 24 provides pulses indicative that F' is too high and that a reduction in frequency of oscillator 10 is required. The charge pump converts these pulses into an analogue voltage Vco' for controlling the oscillator. The output of the charge pump is routed via the electronic switch 14 and a loop amplifier and filter 26 to produce the control voltage Vco at the input of the oscillator 10. The output 23 of the discriminator 22 is routed to one input of a bistable trigger circuit formed by an RS flip flop 27. The other input of the flip flop 27 is coupled to the output of a comparator 28 formed by a differential amplifier having one input coupled to a source of reference voltage V' and its other input coupled to the control input of the oscillator 10. The operation of the circuit is as follows:

1. In normal operation the switch 14 closes the loop and the oscillator 10 is phase locked to the reference frequency $F_{REF}$ and provides an output frequency $F_{OUT}$ that is equal to $F_{REF} \times M$.
2. When the control voltage Vco falls to V', the reference voltage where there is danger of lock up due to self oscillation of the phase lock loop or of oscillation of the divider, the comparator voltage output changes and the bistable circuit is set and provides a control voltage to the switch 14. The switch changes over to the position where it breaks the loop and connects the current source 29 via the loop amplifier 26 to the control input of the oscillator 10 and charge up current is provided to cause the oscillator frequency to increase.
3. When the oscillator frequency is returned to a value which results in pulses on the output line 23, indicating a requirement to increase frequency, the flip flop 27 is reset and the switch 14 changes over to reconnect the loop and return the circuit to normal operation when phase locking and normal operation again occurs.

The divider 11 preferably has a variable division ratio M to enable $F_{OUT}$ to be selected as $F_{REF} \times M$.

The phase lock loop circuit is particularly suitable for use in a radio or television receiver as a local oscillator but has more general applications in for example synthesis and radio transmitters.

We claim:

1. A phase lock loop circuit comprising:
    a variable frequency oscillator having a control input and an output for providing an output frequency;
    a phase and frequency comparator having a first input, a first output line, a second output line, and a second input for receiving a reference frequency;
    a divider coupled between the output of the variable frequency oscillator and the first input;
    a bistable trigger having set and reset inputs, and a switching signal output, one of the set and reset inputs being coupled with the first output line, and the other coupled to the control input of the variable frequency oscillator; and
    a charge pump having a pair of inputs respectively coupled to the first and the second output lines and having a pump output coupled to the control input of the variable frequency oscillator via a switch means which is operative to open the phase lock loop in dependence upon the switching signal output;
    wherein the phase and frequency comparator is arranged for affording, to the charge pump pulses indicative of a required increase in frequency to promote locking via the first output line, and pulses indicative of a required reduction in frequency to promote locking via the second output line, the charge pump is arranged for affording a control signal, which is related to the difference in phase or frequency between the reference frequency and the output frequency to effect phase locking of the variable frequency oscillator to the reference signal, the control signal is applied to the variable frequency oscillator, and the bistable trigger is arranged to be triggered to one stable state thereby to open the switch means when the control signal is representative of a frequency below a predetermined range and to be triggered to the other stable state thereby to close the switch means upon occurrence of pulses indicative of a required increase in frequency to promote locking.

2. A phase lock loop circuit according to claim 1, wherein the other one of the set and reset inputs is coupled to the control input of the variable frequency oscillator via a voltage comparator arranged to provide an output to the bistable trigger when the control signal has a predetermined relationship to a reference voltage supplied to the voltage comparator.

3. A phase lock loop circuit according to claim 1, wherein the switch means is arranged to couple a current source to the control input of the variable frequency oscillator when the phase lock loop is open.

4. A phase lock loop circuit according to claim 1, wherein the divider has a variable division ratio.

* * * * *